(12) United States Patent
Fu et al.

(10) Patent No.: US 6,207,483 B1
(45) Date of Patent: Mar. 27, 2001

(54) METHOD FOR SMOOTHING POLYSILICON GATE STRUCTURES IN CMOS DEVICES

(75) Inventors: Chu-Yun Fu, Taipei; Chung-Long Chang, Dou-Liu; Syun-Ming Jang, Hsin-Chu; Shwangming Jeng, Hsin-Chin, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/527,183

(22) Filed: Mar. 17, 2000

(51) Int. Cl.[7] .................................................. H01L 21/8238
(52) U.S. Cl. ........................ 438/199; 438/488; 438/597; 438/647
(58) Field of Search .................................. 438/488, 647, 438/199, 597

(56) References Cited

U.S. PATENT DOCUMENTS

| 4,540,607 | * | 9/1985 | Tsao . | |
| 4,675,715 | * | 6/1987 | Lepselter et al. . | |
| 5,203,957 | | 4/1993 | Yoo et al. | 156/643 |
| 5,685,941 | * | 11/1997 | Forster et al. . | |
| 5,849,628 | | 12/1998 | Sandhu et al. | 438/488 |
| 5,851,364 | | 12/1998 | Fu et al. | 204/192.3 |
| 5,874,333 | | 2/1999 | Chang et al. | 438/250 |
| 5,888,901 | | 3/1999 | Grivna | 438/637 |
| 6,057,604 | * | 5/2000 | Nguyen | 257/774 |

FOREIGN PATENT DOCUMENTS

| 0884770 | * | 12/1998 | (EP) . |
| 11080962 | * | 3/1999 | (JP) . |

* cited by examiner

Primary Examiner—Long Pham
(74) Attorney, Agent, or Firm—George O. Saile; Stephen B. Ackerman

(57) ABSTRACT

There is provided a method for smoothing the surface of undoped polysilicon regions of a CMOS structure, primarily gate regions. A direct HPD-CVD argon sputter is used improve the surface roughness by a factor of more than 50%. The argon plasma sputter may be used either alone or in conjunction with a thin capping layer of oxide, nitride or oxynitride. The devices manufactured using the process exhibit excellent electrical characteristics and improved reliability compared to devices made using conventional manufacturing processes.

6 Claims, 2 Drawing Sheets

METHOD FOR SMOOTHING POLYSILICON GATE STRUCTURES IN CMOS DEVICES

FIELD OF THE INVENTION

The present invention relates to the manufacturing of CMOS semiconductor devices and, more particularly to a method for reducing the roughness of undoped polysilicon gate regions of CMOS devices during manufacturing.

BACKGROUND OF THE INVENTION

Excessive surface roughness of polysilicon gate structures in CMOS semiconductor devices may present several problems during both during manufacturing and use. If the gate surface is sufficiently rough, typically in the region of a peak to valley difference approximately 200 Å or greater, subsequent deposition operations may be degraded and, ultimately, device performance and/or reliability affected.

DISCUSSION OF THE PRIOR ART

U.S. Pat. No. 5,851,364 for METHOD FOR FORMING ALUMINUM CONTACTS; issued Dec. 22, 1998 to Jianming Fu, et al. teaches the use of an Argon (Ar) plasma treatment for reducing the surface roughness of a titanium nitride (TiN) contact surface prior to depositing an aluminum contact layer. Better adhesion of the Al to the SiN has been observed, essentially due to better wetting of the surface TiN surface by the Al. The present invention, on the other hand, does not utilize an AR plasma step to improve wetting of a contact pad area but rather uses an Ar plasma sputtering deposition on the surface of an undoped polysilicon gate structure to improve manufacturing and performance characteristics. Reducing the roughness of the gate structure results in improved device performance as shown by $I_{OFF}$ vs. $I_{SAT}$ and/or $V_T$ vs. $L_{EFF}$ measurements. In addition, the inventive Ar sputtering of the polysilicon gate surface allows subsequent manufacturing steps to be performed in clustered chambers without breaking vacuum which results in higher line throughput with manufacturing economies resulting.

U.S. Pat. No. 5,874,333 for PROCESS FOR FORMING A POLYSILICON LAYER HAVING IMPROVED ROUGHNESS AFTER POCL3 DOPING; issued Feb. 23, 1999 to Chun-Chich Chang, et al. teaches a method for depositing polysilicon. CHANG, et al. teach depositing the polysilicon in two stages. First, an initial deposition takes place at approximately 630°C. until a predetermined layer thickness is achieved. Layer formation in continued without interruption at approximately 560° C. until the final thickness is achieved. This process yields polysilicon layers with improved smoothness because the final, lower temperature deposition stage results in more controlled grain growth. In contradistinction, the inventive process deposits a polysilicon layer at a single temperature. Subsequent to deposition, an Ar plasma sputter is used to smooth the polysilicon surface before any additional wafer processing steps are performed. The inventive process may be performed in such a manner that vacuum is maintained between the Ar sputter and subsequent wafer processing steps, thereby improving process time and lowering processing costs.

U.S. Pat. No. 5,849,628 for METHOD OF PRODUCING ROUGH POLYSILICON BY THE USE OF PULSED PLASMA CHEMICAL VAPOR DEPOSITION AND PRODUCTS PRODUCED BY SAME; issued Dec. 15, 1998 to Gurtej. S. Sandhu, et al. teaches a process for creating a rough polysilicon surface. Reactant gases including Ar and silane are introduced intermittently into the deposition chamber as the polysilicon layer is deposited. This process has been found useful for producing capacitors as part of DRAM devices. The instant invention is, however, directed to a method for smoothing NOT roughing the surface of a polysilicon layer.

U.S. Pat. No. 5,203,957 for CONTACT SIDEWALL TAPERING WITH Argon SPUTTERING; issued Apr. 20, 1993 to Chu-San Yoo, et al. teaches the use of an Ar sputter for reducing corner sharpness at a contact opening, generally a transition point between anisotropically and isotropically-etched regions. The inventive process, on the other hand, deals with the total surface of an undoped polysilicon gate structure, not just corners. In addition, no post Ar sputter ion etch is performed in the inventive method.

Finally, U.S. Pat. No. 5,888,901 for MULTILEVEL INTERCONNECTION AND METHOD FOR MAKING; issued Mar. 30, 1999 to Gordon M. Grivna teaches a high-pressure sputter etch of a dielectric material such as silicon dioxide between two layers of metalization in a semiconductor structure. A secondary reason is for filling voids in the dielectric with re-deposited silicon dioxide molecules released by the high-pressure Ar sputtering operation. The inventive method, on the other hand, performs a high-pressure Ar sputter in a different manner with a different purpose (i.e., not redeposition of material but rather simply smooth the surface of undoped polysilicon features exposed to the Ar sputter).

Nothing in the above-described or any other known references, taken individually or in any combination, teaches or suggests the unique steps of the present invention.

It is, therefore, an object of the invention to provide a manufacturing step in the production of polysilicon-gate CMOS semiconductors whereby the surface roughness of the gate area is reduced.

It is another object of the invention to provide a manufacturing step in the production of polysilicon-gate CMOS devices which may be performed in clustered chambers on a single mainframe manufacturing line.

It is a still further object of the invention to provide a manufacturing step in the production of polysilicon-gate CMOS devices whereby a MOSFET device having superior electrical performance and/or reliability is achieved.

SUMMARY OF THE INVENTION

The present invention features a method for smoothing the surface of undoped polysilicon regions of a CMOS structure, primarily gate regions. A direct HPD-CVD argon sputter is used improve the surface roughness, either alone or in conjunction with a thin capping layer of oxide, nitride or oxynitride.

BRIEF DESCRIPTION OF THE DRAWINGS

A complete understanding of the present invention may be obtained by reference to the accompanying drawings, when taken in conjunction with the detail description thereof and in which.

DESCRIPTION OF THE PREFERRED EMBODIMENT

Generally speaking this invention relates to the manufacturing of VLSI CMOS integrated circuits and, more specifically, to an improved process for smoothing the surface of a polysilicon gate region by means of direct Argon plasma sputtering. An additional capping layer of oxide, nitride, or oxynitride may be used in conjunction with the Ar sputter to achieve a desired smoothness.

Figure 1:
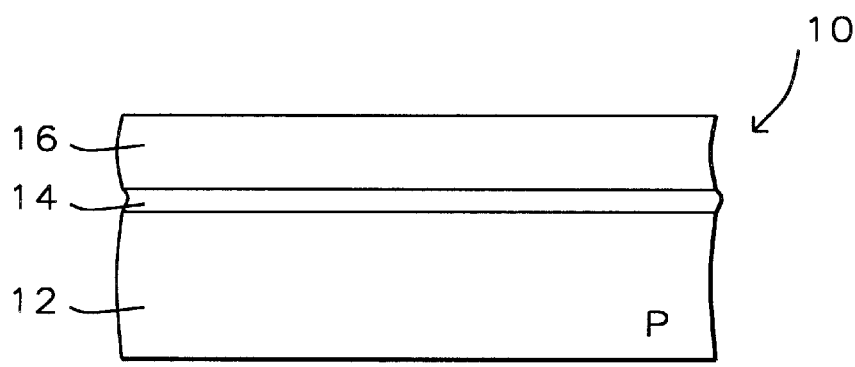
FIG. 1 is a cross-sectional, schematic view of a portion of a silicon wafer.

Referring first to FIG. 1, there is shown a schematic sectional of a portion of a silicon wafer 10. A p-type monocoustalline silicon substrate 12 has a gate oxide layer 14 deposited on its surface. Gate oxide layer 14 is typically in the range of 20 Å to 100 Å and is usually formed by thermal oxidation. A polysilicon layer 16 having a thickness typically in the range of 1000 Å to 3000 Å is deposited directly over gate oxide layer 14, generally by means of LPCVD or another similar deposition techniques. The exact thickness and method of deposition of polysilicon layer 16 may be varied to suite a particular operating requirement or environment and forms no part of the instant invention. Regardless of the thickness of polysilicon layer 16, its top surface is not perfectly smooth.

Figure 2:
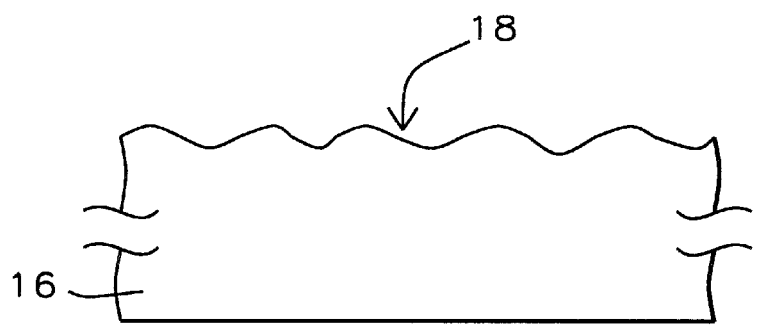
FIG. 2 is an enlarged view of a portion of the silicon wafer of FIG. 1.

Referring now also to FIG. 2, there is shown a detailed, sectional view of polysilicon layer 16. Variations between peaks and valleys in surface 18 in the range of approximately 250 Å or more in a polysilicon layer 16 having a thickness of approximately 2000 Å are not uncommon. This degree of surface roughness results in several problems both in subsequent processing steps as well as with device performance and/or reliability. For example, surface roughness of polysilicon layer 16 may lead to problems with poly CD controls, silicide formation and over-etching of the oxide or nitride spacers.

Fabrication techniques for gate structures, well known to those skilled in the art, would generally next include an ion implantation (typically using Phosphorus), a cleaning step and finally metalization of the gate structure. In accordance with the inventive method, a direct argon plasma sputter is performed which reduces the surface roughness of the polysilicon layer 16. The sputter is performed in a high density plasma chemical vapor deposition (HPD-CVD) chamber at approximately 1300 watts plus 3100 watts top and side source RF and 800 watts RF bias. Approximately 110+16 sccm argon plus approximately 110+16 sccm oxygen ($O_2$) are used for the sputter at a rate of approximately 350 Å/minute. Using this sputter, the surface roughness of surface 18 of polysilicon layer 16 is reduced from the approximately 200 Å–250 Å range (for a 2000 Å thick polysilicon thickness) to a minimum to maximum range of approximately 100 Å–120 Å, a reduction of between approximately 50% and 60%. Translated to an RMS value, the surface roughness of the Ar sputtered layer is approximately 16 Å–20 Å RMS.

Because the inventive Ar sputter step inserted at this point in the wafer process is compatible with the preceding dielectric deposition steps, as well as with subsequent dielectric hardmask deposition steps, the Ar sputter may be performed in clustered chambers on the same mainframe line without breaking vacuum. This yields manufacturing efficiencies with consequent manufacturing cost advantages.

Figure 3:
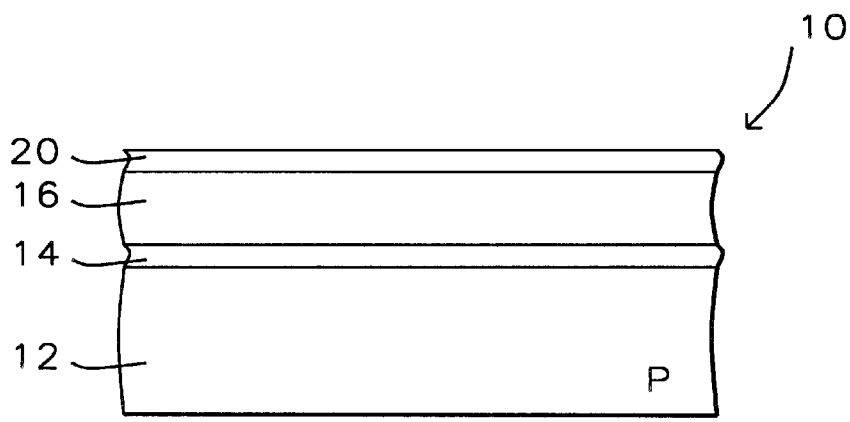
FIG. 3 is a sectional, schematic view of the portion of the silicon wafer of FIG. 1 with a cap oxide/nitride layer added to the polysilicon layer.

In an alternate embodiment shown in FIG. 3, a cap layer 20 of oxide, nitride or oxynitride is deposited over the polysilicon layer 16 prior to the Ar sputter. A PE-CVD or similar process such as SA-CVD or HP-CVD may be used for the oxide/nitride deposition. The HDP-CVD Ar sputter as described hereinabove may then be performed which removes the oxide/nitride layer and re-exposes the surface of the polysilicon. It has been shown that while similar surface roughness reduction is observed, there appears to be no significant improvement in polysilicon surface roughness over the direct HDP-CVD Ar sputter performed directly on the polysilicon layer 16. However, poly thickness loss is reduced if the capping layer is deposited prior to Ar sputter.

Various combination of sputter iterations and sputter deposition depths have also been tried but the conditions and parameters disclosed hereinabove appear to provide the optimum polysilicon surface roughness reduction.

Figure 4:
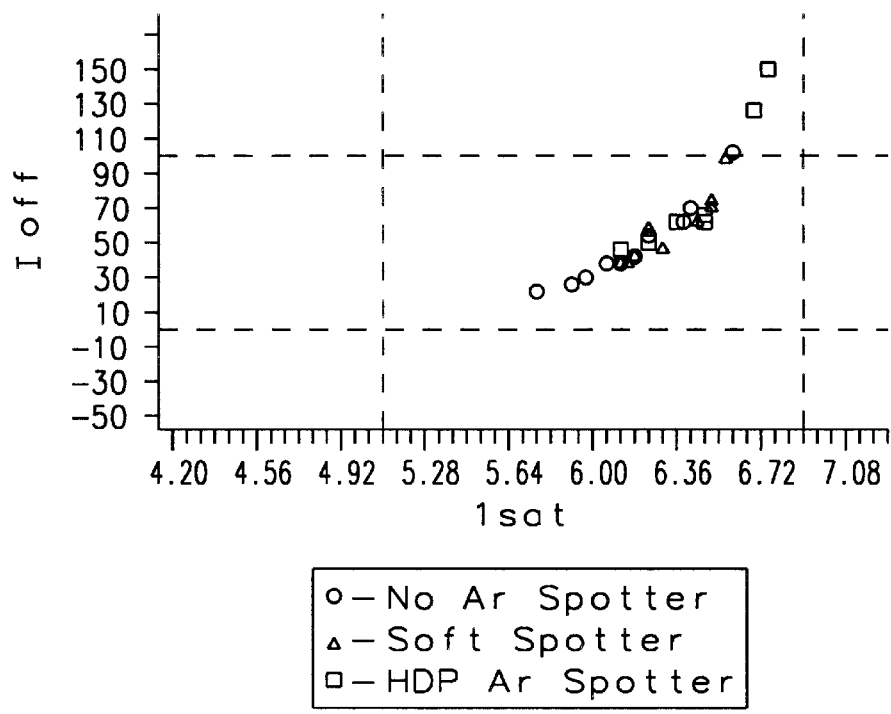
FIG. 4 is a graph of Ioff vs Isat for a typical device made in accordance with the present invention.
Figure 5:
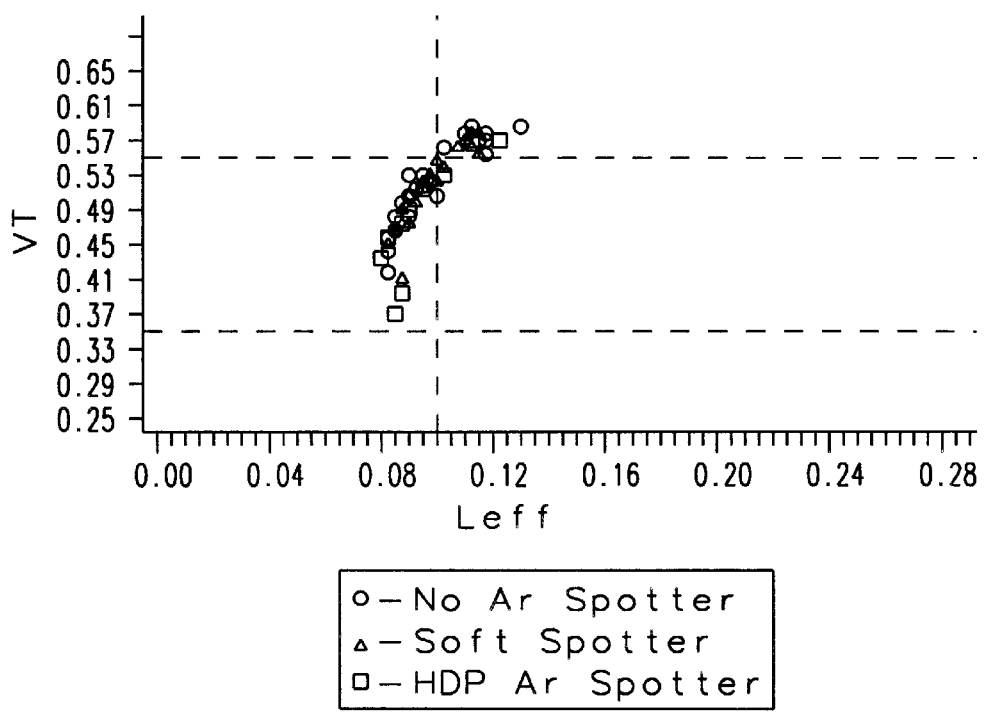
FIG. 5 is a graph of VT vs Leff for a typical device made in accordance with the present invention.

Referring now to FIGS. 4 and 5, there are shown graphs of $I_{OFF}$ Vs. $I_{SAT}$ and $V_T$ vs. $L_{EFF}$, respectively. In both FIGS. 4 and 5, data is plotted for three conditions: no Ar sputter, a soft Ar sputter and the HPD Ar sputter of the instant invention. In FIG. 4, superior IOFF vs ISAT performance of the wafers undergoing the inventive step is clearly shown. In FIG. 5, the tight clustering of the data for the three measured conditions shows that substantially equivalent VT vs Leff performance is obtained (i.e., there is no degradation introduced by the inventive step).

It will be obvious to those skilled in the silicon processing arts that numerous variations of energies, conditions and time could be utilized without departing from the instant invention.

Since other modifications and changes varied to fit a particular operating requirements and environment will be apparent to those skilled in the art, the invention is not considered limited to the example chosen for purposes of disclosure, and covers all changes and modifications which do not constitute a departure from the true spirit and scope of the invention.

Having thus described the invention, what is desired to be protected by Letters Patent is presented in the subsequent appended claims.

What is claimed is:

1. A method for manufacturing CMOS semiconductor devices having smooth polysilicon gate structures, the steps comprising:

a) providing a silicon substrate having a gate oxide layer deposited thereupon;

b) depositing a polysilicon layer having a predetermined thickness and a surface roughness of a first value on said gate oxide layer; and c) performing a direct argon sputter of said polysilicon layer in a high density plasma chemical vapor deposition chamber at an energy level of approximately 1300 watts top source rf plus approximately 3100 watts top and side source rf energy and approximately 800, watts rf bias, whereby said surface roughness is reduced to a second value.

2. The method for manufacturing CMOS semiconductor devices having smooth polysilicon gate structures as recited in claim 1, wherein said depositing step (b) comprises a low-pressure chemical vapor deposition (LPCVD) process.

3. The method for manufacturing CMOS semiconductor devices having smooth polysilicon gate structures as recited in claim 2, wherein said thickness of said polysilicon layer is in the range of approximately 1000 Å to 3000 Å.

4. The method for manufacturing CMOS semiconductor devices having smooth polysilicon gate structures as recited in claim 1, herein said second, predetermined surface roughness is in the range of approximately 100 Å to 120 Å peak to valley.

5. The method for manufacturing CMOS semiconductor devices having smooth polysilicon gate structures as recited in claim 1, further comprising the step:

d) depositing a cap layer of at least one of the group of materials: oxide, nitride and oxynitride prior to said direct argon sputtering step (c).

6. The method for manufacturing CMOS semiconductor devices having smooth polysilicon gates as recited in claim 1 wherein said direct argon sputter reduces peak-to-valley surface roughness of said polysilicon gate layer by a factor of at least fifty percent.

\* \* \* \* \*